(12) United States Patent
Tung et al.

(10) Patent No.: US 11,610,900 B2
(45) Date of Patent: Mar. 21, 2023

(54) SEMICONDUCTOR MEMORY DEVICE

(71) Applicant: Fujian Jinhua Integrated Circuit Co., Ltd., Quanzhou (CN)

(72) Inventors: Yu-Cheng Tung, Kaohsiung (TW); Janbo Zhang, Zhangzhou (CN)

(73) Assignee: Fujian Jinhua Integrated Circuit Co., Ltd., Quanzhou (CN)

(*) Notice: Subject to any disclaimer, the term of this patent is extended or adjusted under 35 U.S.C. 154(b) by 0 days.

(21) Appl. No.: 17/376,114

(22) Filed: Jul. 14, 2021

(65) Prior Publication Data

US 2022/0359535 A1  Nov. 10, 2022

(30) Foreign Application Priority Data

May 7, 2021  (CN) .......................... 202110494413.X
May 7, 2021  (CN) .......................... 202120957359.3

(51) Int. Cl.
   *H10B 12/00*  (2023.01)
   *H01L 27/108*  (2006.01)

(52) U.S. Cl.
   CPC .............................. *H01L 27/10897* (2013.01)

(58) Field of Classification Search
   CPC ................................................ H01L 27/10897
   See application file for complete search history.

(56) References Cited

U.S. PATENT DOCUMENTS

| | | | |
|---|---|---|---|
| 11,011,526 B2* | 5/2021 | Park | H01L 27/10897 |
| 2018/0226408 A1* | 8/2018 | Feng | H01L 23/5283 |
| 2019/0157277 A1* | 5/2019 | Wu | H01L 27/10805 |
| 2020/0066728 A1* | 2/2020 | Lu | H01L 27/10885 |
| 2020/0152584 A1* | 5/2020 | Sohn | H01L 23/522 |

FOREIGN PATENT DOCUMENTS

| | | | | |
|---|---|---|---|---|
| CN | 108389860 B | * | 6/2021 | H01L 23/5283 |
| CN | 114038849 A | * | 2/2022 | |

* cited by examiner

*Primary Examiner* — Edward Chin
(74) *Attorney, Agent, or Firm* — Winston Hsu

(57) ABSTRACT

The invention provides a semiconductor storage device including a substrate, a plurality of active areas which are arranged along an oblique direction, a dummy active area pattern, and the dummy active area pattern comprises a first edge principal axis pattern and a plurality of first long branches and a plurality of short branches connecting edge principal axis patterns, and a plurality of storage nodes are in contact with each other. According to the invention, a part of the storage node contacts are arranged on the dummy active area pattern, so that the difficulty of the manufacturing process can be reduced, and the surrounding storage node contacts can serve as protection structures to protect components and prevent the components from being physically or electrically affected.

13 Claims, 3 Drawing Sheets

SEMICONDUCTOR MEMORY DEVICE

BACKGROUND OF THE INVENTION

1. Field of the Invention

The present invention relates to a semiconductor device, in particular to a semiconductor memory device.

2. Description of the Prior Art

With the trend of miniaturization of various electronic products, the design of dynamic random access memory, DRAM) cells must also meet the requirements of high integration and high density. For a DRAM cell with recessed gate structure, because it can obtain longer carrier channel length in the same semiconductor substrate to reduce the leakage of capacitor structure, it has gradually replaced the DRAM cell with only planar gate structure under the current mainstream development trend.

Generally, a DRAM cell with a recessed gate structure includes a transistor device and a charge storage device to receive voltage signals from bit lines and word lines. However, due to the limitation of process technology, the existing DRAM cells with recessed gate structure still have many defects, which need to be further improved to effectively improve the performance and reliability of related memory devices.

SUMMARY OF THE INVENTION

The invention discloses a semiconductor storage device, which is characterized by comprising a substrate, a plurality of active areas located on the surface of the substrate, and each active area is arranged along an oblique direction, wherein a dummy active area pattern which surrounding the active area comprises a first edge principal axis pattern and a plurality of first long branches and a plurality of short branches connecting the edge principal axis pattern, and a plurality of storage nodes contact the first long branch of the dummy active area pattern, but do not contact the short branch of the dummy active area pattern.

The feature of the present invention is that, unlike the known technology, storage node contacts (SC) are usually only arranged at both ends of an active area (AA) in a memory cell region, but not in an periphery region, the present invention not only sets storage node contacts on the active area, but also sets a part of storage node contacts on a dummy active area pattern in the periphery region. Although the dummy active pattern is not used as a component, a part of the storage node contacts are arranged on the dummy active area pattern in the periphery region, which can reduce the difficulty of the manufacturing process, and the surrounding storage node contacts can serve as a protection structure to protect the intermediate memory cell region components and prevent the components from being physically or electrically affected.

These and other objectives of the present invention will no doubt become obvious to those of ordinary skill in the art after reading the following detailed description of the preferred embodiment that is illustrated in the various figures and drawings.

DETAILED DESCRIPTION

In order to enable those familiar with the technical field of the present invention to have a better understanding of the present invention, several preferred embodiments of the present invention are listed below, and with the accompanying drawings, the composition and the desired effects of the present invention are described in detail.

Figure 1:
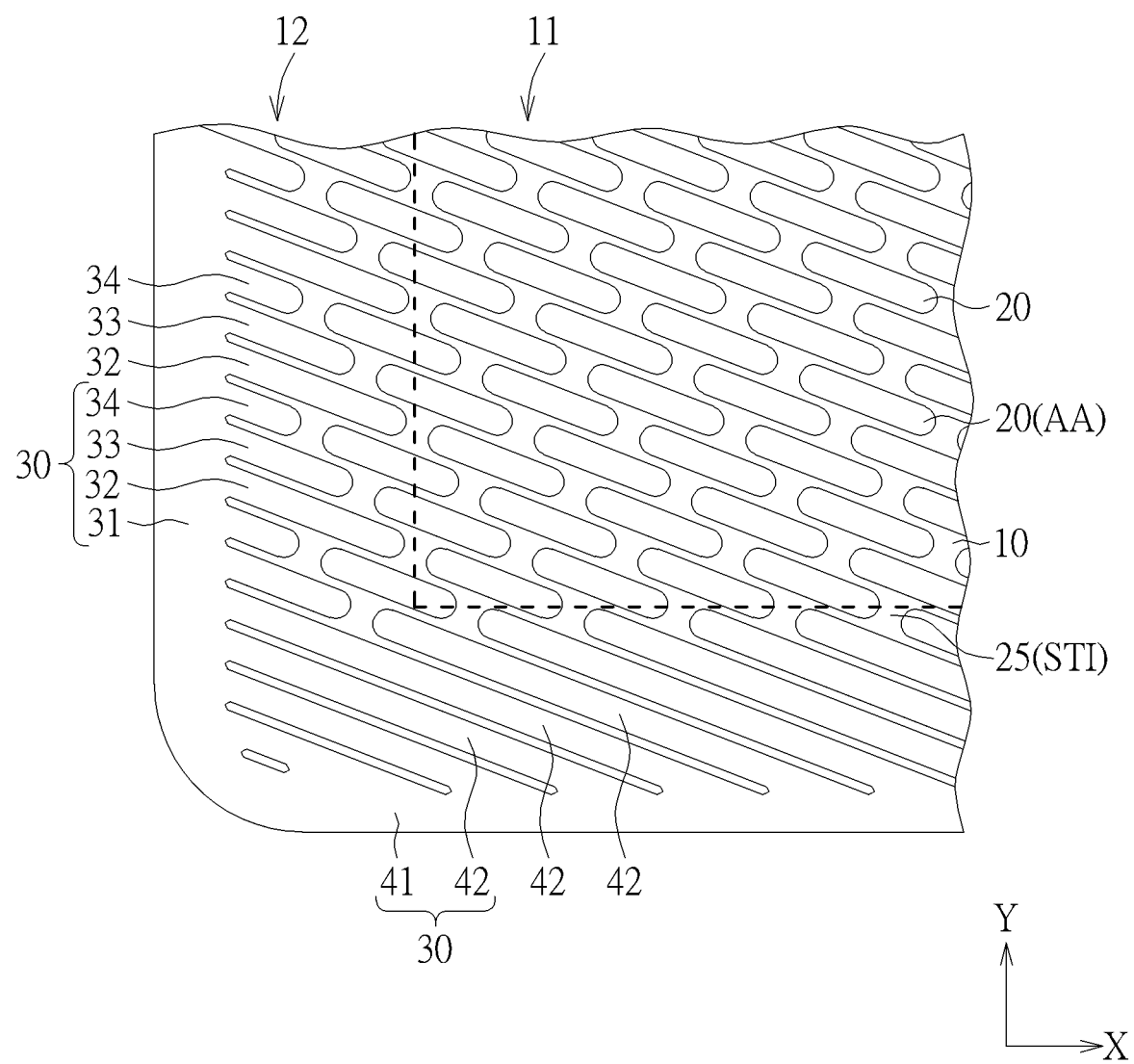
FIG. 1 shows a partial top view of an active area in a memory cell region and a dummy active area pattern in an periphery region according to the present invention.

As shown in FIG. 1, the present invention provides a semiconductor device 1, which includes a substrate 10 on which a memory cell region 11 and a periphery region 12 surrounding the memory cell region are defined. The semiconductor memory device is, for example, a dynamic random access memory (DRAM) including a recessed gate, which includes at least one transistor element (not shown) and at least one capacitor structure (not shown) as the smallest component unit in the DRAM array and receives voltage signals from word lines (WL) and bit lines (BL). In this embodiment, in order to simplify the drawing, the positions of word lines and bit lines are not drawn.

Specifically, the semiconductor memory device includes a substrate 10, for example, a silicon substrate, a silicon-containing substrate (such as SiC, SiGe) or a silicon-on-insulator (SOI) substrate, etc. A plurality of active areas (AA) 20 are defined in the memory cell region 11 of the substrate 10, and the active area, (AA) 20 are parallel to each other and spaced apart from each other, and are arranged in a matrix. The active area 20 is fabricated by, for example, forming a plurality of stripe patterns arranged in parallel along the oblique direction D1, then cutting the stripe pattern into a plurality of segments by patterning steps such as etching, and then forming a shallow trench isolation (STI) 25 covering the substrate 10, wherein the area exposed by the STI 25 is defined as the active area 20. The manufacturing method of the active area 20 described above belongs to the conventional technology in the field, and other details will not be described in detail.

In addition, a dummy active pattern 30 are included in the periphery region 12, wherein the dummy active patterns 30 come from the fact that some edge patterns that are not completely cut off are left in the periphery region 12 on the substrate 10 during the manufacturing process of the active area 20, thus forming the dummy active patterns 30. These dummy active patterns 30 may not be separated from each other like the active areas 20, but are connected to each other to form a continuous structure, so they can not be used as components in actual manufacturing process. In the known technology, it is also common not to continue to form components on the dummy active pattern 30.

In this embodiment, the dummy active pattern 30 is located at one boundary (for example, the left boundary) of the periphery region 12, and the dummy active pattern 30 includes an edge principal axis pattern and a plurality of long branches and short branches are connected with the edge principal axis pattern. For example, the first edge principal axis pattern 31 is arranged along a first direction (e.g., Y direction), and a plurality of first long branches 32, a plurality of second long branches 33 and a plurality of short branches 34 are connected to the first edge principal axis pattern 31. The length of the first long branch 32 is longer than that of the second long branch 33, which is longer than that of the short branch 34. Seen from top to bottom along the first direction, each branch is circularly arranged in the order of the short branch 34, the second long branch 33 and the first long branch 32. In addition, the first long branch 32, the second long branch 33, and the short branch 34 are all arranged in an oblique direction, that is, in the same direction as the active area 20.

In addition, besides the first edge principal axis pattern 31 and its branches located at one side of the periphery region 12, other boundaries of the periphery region 12 may also contain dummy active patterns. For example, as shown in FIG. 1, another part of the dummy active pattern 30 is located at the lower boundary of the periphery region 12, and the lower boundary part of the dummy active pattern 30 may contain long branches and short branches staggered (just like the left boundary part of the dummy active pattern 30), or only contain branches of the same length. Taking this embodiment as an example, the lower boundary portion of the dummy active pattern 30 includes a second edge principal axis pattern 41 arranged along a second direction (e.g., X direction), and a plurality of second edge branches 42 connected to the second edge principal axis pattern 41 are arranged along the oblique direction D1, wherein the lengths of the second edge branches 42 are the same as each other.

It can be understood that only two boundaries of the periphery region 12 are drawn in FIG. 1, which are the first edge principal axis pattern 31 and the second edge principal axis pattern 41. However, the periphery region 12 may contain more boundaries, such as the upper boundary and the right boundary, which are not shown in this embodiment for the sake of simplicity of the drawing.

Figure 2:
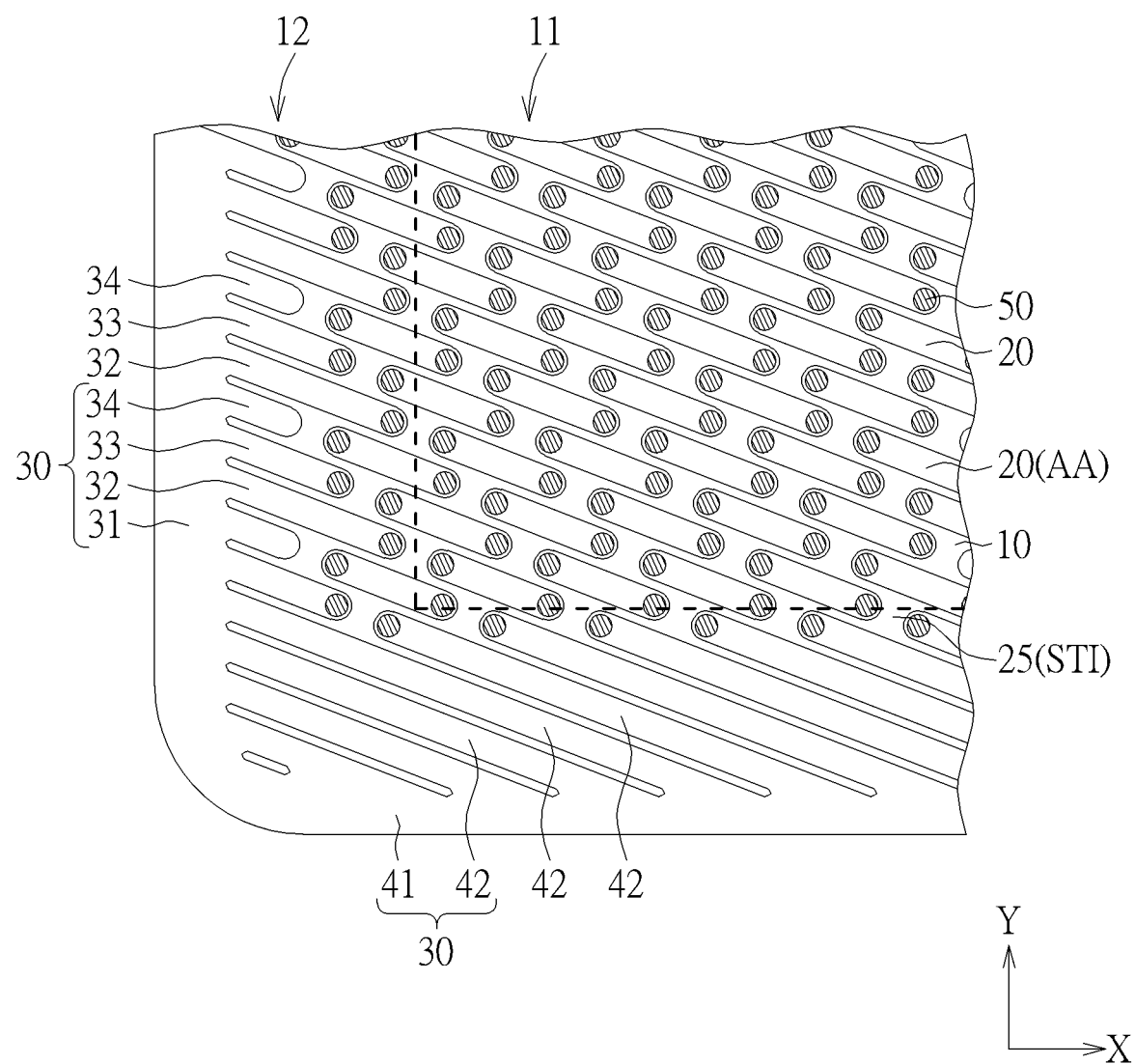
FIG. 2 shows a schematic diagram of forming a storage node contact (SC) on an active area and a dummy active area pattern according to an embodiment of the present invention.

FIG. 2 shows a schematic diagram of forming a storage node contact (SC) on an active area and a dummy active area pattern according to an embodiment of the present invention. As shown in FIG. 2, a plurality of storage node contacts 50 are formed. The storage node contact 50 described here is, for example, a contact component connecting the substrate (active area 20) and a capacitor structure (not shown). Generally speaking, because only the active areas 20 in the memory cell region 11 are used as components, in the known technology, only the storage node contacts 50 are formed at both ends of each active area 20 in the memory cell region 11. However, the difference between the present invention and the known technology is that besides forming the storage node contact 50 on the active area 20 in the memory cell region 11, the storage node contact 50 will also be formed on a part of the dummy active pattern in the periphery region 12, for example, on the dummy active pattern 30.

Taking this embodiment as an example, a part of the storage node contacts 50 are formed on the dummy active pattern 30, the storage node contacts 50 may be formed at the ends of the first long branch 32 and the second long branch 33 closer to the memory cell region 11, but are not formed on the short branch 34. The advantage of this configuration is that when the storage node contacts 50 are formed, the distribution range of the storage node contacts 50 is slightly expanded into the periphery region 12, so the manufacturing difficulty can be reduced. In addition, although the storage node contacts 50 formed in the periphery region 12 are not used as electronic components, they are arranged around the memory cell region 11, which can protect the components in the active area and prevent the components in the active area from being physically or electrically affected.

Figure 3:
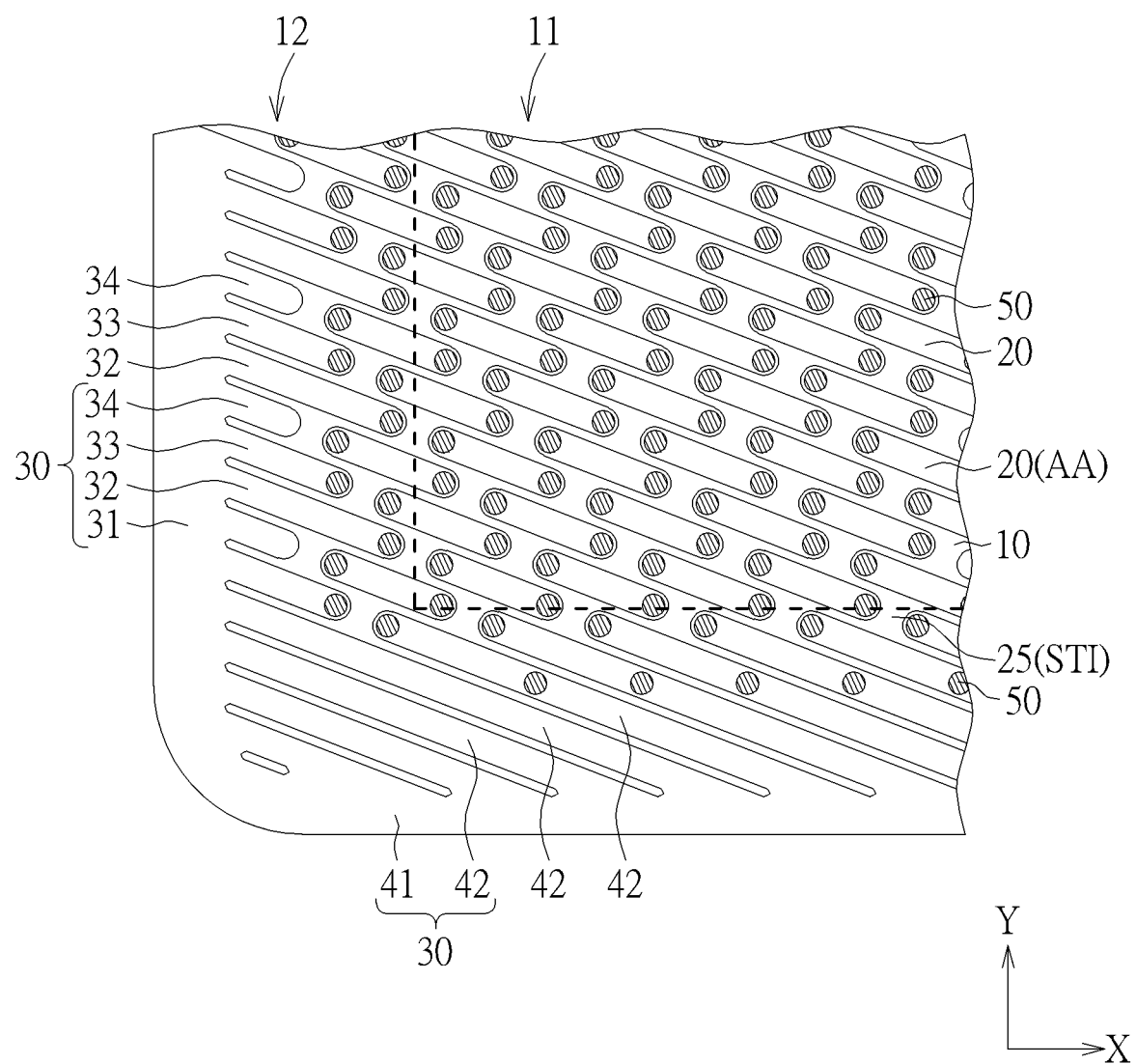
FIG. 3 shows a schematic diagram of forming a storage node contact (SC) on an active area and a dummy active area pattern according to another embodiment of the present invention.

In other embodiments of the present invention, the storage node contact 50 may also be formed on the other side of the dummy active pattern, for example, at the end of each second edge branch 42 of the dummy active pattern 30, or as shown in FIG. 3, FIG. 3 shows a schematic diagram of forming storage node contacts (SC) on active areas and dummy active area patterns according to another embodiment of the present invention. In this embodiment, the storage node contact 50 may be formed not only at the terminal portion of each second edge branch 42, but also at the middle portion of the second edge branch 42 (and the storage node contact 50 originally located at the terminal portion of the second edge branch 42 may or may not exist selectively), which also falls within the scope of the present invention.

It is worth noting that some other components, such as word lines, bit lines, bit line contacts, etc., are also formed before forming the storage node contacts 50. After forming the storage node contact 50, it may also include forming, for example, a capacitor structure to connect the storage node contact with the active area. These components belong to the well-known technology in the field. These components are not shown in the present invention for the sake of simplicity, but they should exist in the semiconductor memory device.

According to the above description and drawings, the present invention provides a semiconductor memory device, which is characterized by comprising a substrate 10, a memory cell region 11 and an periphery region 12 surrounding the memory cell region 11, a plurality of active areas 20 located on the surface of the substrate 10 and in the memory cell region 11, and each active area 20 is arranged along an oblique direction D1, and the periphery region 12 contains a dummy active area pattern 30. The dummy active area pattern 30 includes a first edge principal axis pattern 31, a plurality of first long branches 32 and a plurality of short branches 34 connected with the first edge principal axis pattern 31. A plurality of storage node contacts 50 contact the first long branches 32 of the dummy active area pattern 30 but do not contact the short branches 34 of the dummy active area pattern 30.

In some embodiments, a plurality of storage nodes contact 50 further contact both ends of a plurality of active areas 20 in the memory cell region 11.

In some embodiments, the first edge principal axis pattern 31 of the dummy active area pattern 30 is arranged along a first direction (Y direction), wherein the first direction is different from the oblique direction D1.

In some embodiments, the first long branches 32 are alternately arranged with the short branches 34 along the first direction D1.

In some embodiments, the dummy active area pattern 30 further comprises a second edge principal axis pattern, wherein the second edge principal axis pattern is arranged along a second direction (X direction), wherein the second direction is perpendicular to the first direction.

In some embodiments, the second edge principal axis pattern 41 includes a plurality of second edge branches 42 connecting the second edge principal axis pattern 41, and each second edge branch 42 is arranged along the oblique direction D1.

In some embodiments, a portion of the storage node contacts 50 are located at the terminal portion of the second edge branch 42.

In some embodiments, some of the storage node contacts 50 are located in the middle portion of the second edge branch 42.

In some embodiments, the first long branch 32 and the short branch 34 of the dummy active area pattern 30 are arranged along the oblique direction D1.

In some embodiments, one end of the first long branch 32 is oval, and the other terminal is connected with the edge principal axis pattern.

In some embodiments, the dummy active area pattern 30 further includes a plurality of second long branches 33 arranged along the oblique direction D1 and connected to the first edge principal axis pattern 31.

In some embodiments, at least one storage node contact 50 contacts the second long branch 33.

In some embodiments, the active area 20 in each memory cell region 11 does not contact the dummy active area pattern 30 in the periphery region 12.

In some embodiments, a shallow trench isolation 25 is further included on the substrate 10, wherein each active area 20 and the dummy active area pattern 30 are exposed by the shallow trench isolation 25.

In some embodiments, the material of the active area 20 includes silicon, and the material of the dummy active area pattern 30 also includes silicon.

To sum up, the present invention is characterized in that, unlike the conventional technology in which the storage node contacts (SC) are only arranged at both ends of an active area (AA) in a memory cell region, but not in an periphery region, the present invention not only sets the storage node contacts on the active area, but also sets a part of the storage node contacts on a dummy active area pattern in the periphery region. Although the dummy active pattern is not used as a component, a part of the storage node contacts are arranged on the dummy active area pattern in the periphery region, which can reduce the difficulty of the manufacturing process, and the surrounding storage node contacts can serve as a protection structure to protect the memory cell region components and prevent the components from being physically or electrically affected.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate;
   a plurality of active areas located on the surface of the substrate, and each active area is arranged along an oblique direction;
   a dummy active area pattern which surrounding the active area comprises a first edge principal axis pattern and a plurality of first long branches and a plurality of short branches connecting the edge principal axis pattern, wherein a material of the active area, a material of the dummy active area and a material of the substrate are made of silicon;
   a shallow trench isolation structure located on the substrate, wherein each active area and the dummy active area pattern are defined by the shallow trench isolation structure; and
   a plurality of storage nodes contact the first long branch of the dummy active area pattern, but do not contact the short branch of the dummy active area pattern.

2. The semiconductor memory device according to claim 1, wherein the storage nodes are in contact with both ends of the active areas.

3. The semiconductor memory device according to claim 1, wherein the first edge principal axis pattern of the dummy active area pattern is arranged along a first direction, wherein the first direction is different from the oblique direction.

4. The semiconductor memory device according to claim 3, wherein the first long branches and the short branches are alternately arranged along the first direction.

5. The semiconductor memory device according to claim 1, wherein the dummy active area pattern further comprises a second edge principal axis pattern, wherein the second edge principal axis pattern is arranged along a second direction, wherein the second direction is perpendicular to the first direction.

6. The semiconductor memory device according to claim 5, wherein the second edge principal axis pattern comprises a plurality of second edge branches connected to the second edge principal axis pattern, and each second edge branch is arranged along the oblique direction.

7. The semiconductor memory device according to claim 6, wherein a part of the storage node contacts are located at a terminal portion of the second edge branch.

8. The semiconductor memory device according to claim 1, wherein a part of the storage node contacts are located in a middle portion of the second edge branch.

9. The semiconductor memory device according to claim 1, wherein the first long branch and the short branch of the dummy active area pattern are arranged along the oblique direction.

10. The semiconductor memory device according to claim 1, wherein one terminal of the first long branch is oval, and the other terminal is connected to the edge principal axis pattern.

11. The semiconductor memory device according to claim 1, wherein the dummy active area pattern further comprises a plurality of second long branches arranged along the oblique direction and connected to the first edge principal axis pattern.

12. The semiconductor memory device according to claim 11, wherein at least one storage node contacts the second long branch.

13. The semiconductor memory device according to claim 1, wherein the active area does not contact the dummy active area pattern.

\* \* \* \* \*